United States Patent
Fattal et al.

(10) Patent No.: US 8,643,318 B2
(45) Date of Patent: Feb. 4, 2014

(54) HIGH-RESOLUTION AND LOW-RESOLUTION SENSORS FOR PHASE DETECTION

(75) Inventors: Souren G. Fattal, Palatine, IL (US); John Duward Sagona, Poplar Grove, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 312 days.

(21) Appl. No.: 13/092,617

(22) Filed: Apr. 22, 2011

(65) Prior Publication Data

US 2012/0268974 A1    Oct. 25, 2012

(51) Int. Cl.
  *G05B 11/28*    (2006.01)
(52) U.S. Cl.
  USPC ..................................... 318/400.04; 323/258
(58) Field of Classification Search
  USPC ................. 318/138, 466, 439, 700, 724, 600; 323/265, 268, 271, 282–288; 307/116, 307/130
  See application file for complete search history.

(56) References Cited

U.S. PATENT DOCUMENTS

| | | | | |
|---|---|---|---|---|
| 4,301,351 A | * | 11/1981 | Mathews | 219/114 |
| 5,698,964 A | * | 12/1997 | Kates et al. | 320/164 |
| 5,850,130 A | * | 12/1998 | Fujisaki et al. | 318/400.2 |
| 6,108,226 A | * | 8/2000 | Ghosh et al. | 363/142 |
| 6,243,652 B1 | * | 6/2001 | Fawcett et al. | 702/65 |
| 6,285,149 B1 | * | 9/2001 | Brenden et al. | 318/400.04 |
| 7,772,904 B1 | * | 8/2010 | Cooke | 327/175 |

* cited by examiner

*Primary Examiner* — Rajnikant Patel
(74) *Attorney, Agent, or Firm* — Kinney & Lange, P.A.

(57) ABSTRACT

A phase detection system includes a low-resolution sensor and a high-resolution sensor for monitoring an alternating current (AC) voltage. A phase detector receives voltage samples from both the low-resolution sensor and the high-resolution sensor. The phase detector monitors the low-resolution sensor to detect approaching zero cross events (i.e., monitored voltage values approaching zero). In response to an approaching zero-cross event, the phase detector uses the magnitude of the high-resolution voltage samples measured on either side of the zero cross event to determine the phase of the monitored AC voltage.

16 Claims, 2 Drawing Sheets

HIGH-RESOLUTION AND LOW-RESOLUTION SENSORS FOR PHASE DETECTION

BACKGROUND

The present invention relates generally to phase detection, and in particular to phase detection based on the magnitude of monitored voltage.

Phase detection associated with alternating current (AC) signals is an important part of many control algorithms, such as control algorithms employed in active rectification applications. The measured AC source voltage is used to calculate both the phase and frequency of the AC voltage source. The measured AC voltage is required to be measured accurately to calculate accurate phase and frequency of the AC voltage source to meet stringent power quality requirements of the aerospace industry.

SUMMARY

A phase detection system includes a low-resolution sensor and a high-resolution sensor for monitoring an alternating current (AC) voltage. A phase detector receives voltage samples from both the low-resolution sensor and the high-resolution sensor. The phase detector monitors the low-resolution sensor to detect approaching zero cross events (i.e., monitored voltage values approaching zero). In response to an approaching zero-cross event, the phase detector uses the magnitude of the high-resolution voltage samples measured on either side of the zero cross event to determine the phase of the monitored AC voltage.

DETAILED DESCRIPTION

A zero-cross based phase detection system detects the phase of a monitored AC input. In particular, phase detection is based on the magnitude of the AC voltage signal sampled near a zero-cross event of the AC input. The zero-cross phase detection system employs voltage signals monitored by a high-resolution sensor near the zero-cross event to improve the accuracy of the monitored voltage magnitudes. A low-resolution sensor is employed elsewhere over the entire range (i.e., peak-to-peak voltage) of the monitored AC input.

Figure 1:
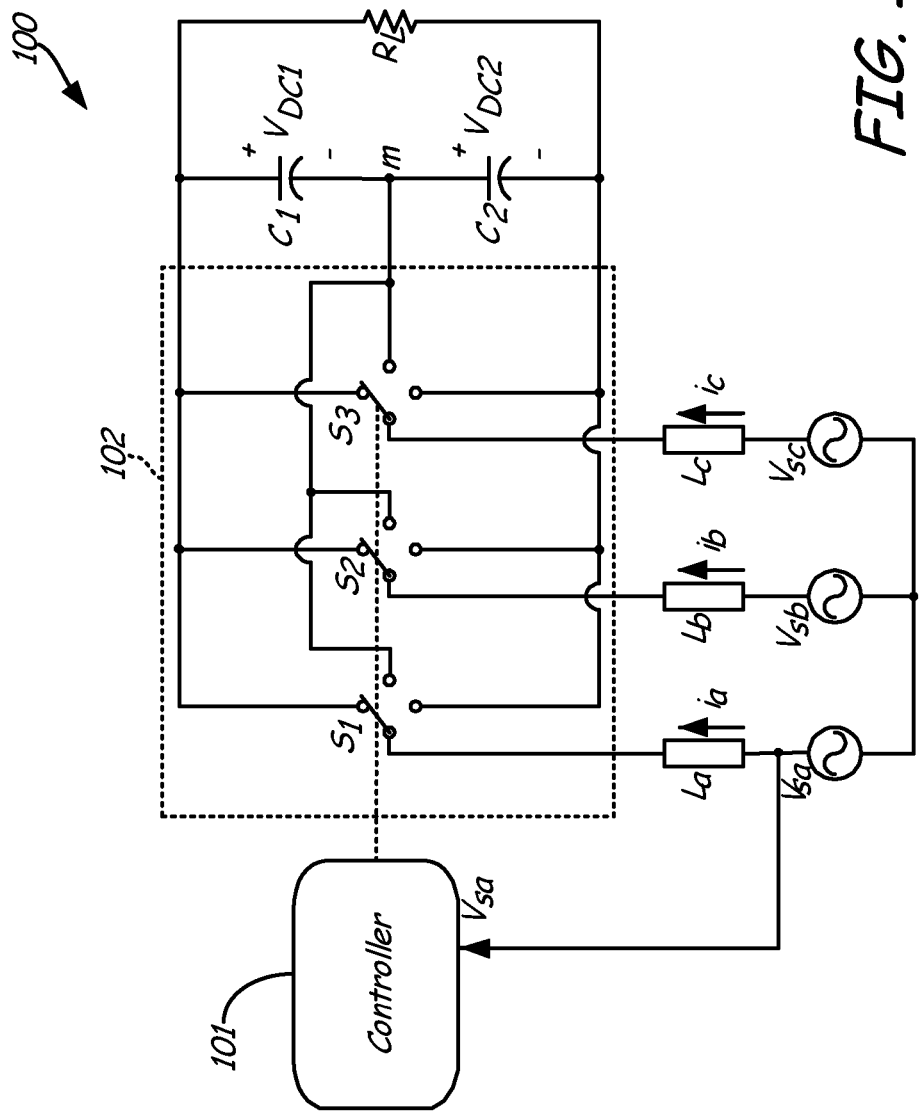
FIG. 1 is a circuit diagram of an active rectification system according to an embodiment of the present invention.

FIG. 1 is a circuit diagram of an active rectification system 100 according to an embodiment of the present invention. The active rectification system 100 shown in FIG. 1 represents one application in which zero-cross based phase and frequency detection may be employed, although a variety of other applications may make use of this type of phase and frequency detection. In the active rectification system 100, $Vs_a$, $Vs_b$, $Vs_c$ represent a source input three-phase voltage and $Vp_a$, $Vp_b$, $Vp_c$ represent a three-phase pole voltage. An active rectifier 102, which includes a plurality of active switching devices S1, S2, S3, converts the source input three-phase voltage $Vs_a$, $Vs_b$, $Vs_c$ to a DC output Vdc. However, the accuracy of this conversion (and therefore the efficiency of the active rectifier) depends on phase and frequency information associated with the monitored AC input signal.

In the embodiment shown in FIG. 1, the active rectifier 102 is a three-phase three-level active rectifier that provides a first DC voltage $V_{DC1}$ across capacitor C1 and a second DC voltage $V_{DC2}$ across capacitor C2. The sum of the first DC voltage and the second DC voltage represents the DC output voltage of the active rectifier 102 available for provision to a load such as resistor $R_L$. Although a three-phase three-level active rectifier is illustrated, it should be understood that other embodiments are not limited to the illustrated topology.

As illustrated, the controller 101 is in electrical communication with each of the switches $S_1$, $S_2$, and $S_3$. During operation, the controller 101 selectively controls the three states of the switches $S_1$, $S_2$, and $S_3$ to regulate the DC output voltage to a desired value. The controller 101 uses the AC input voltage $Vs_a$ to detect the phase and frequency of the AC input signal.

Figure 2:
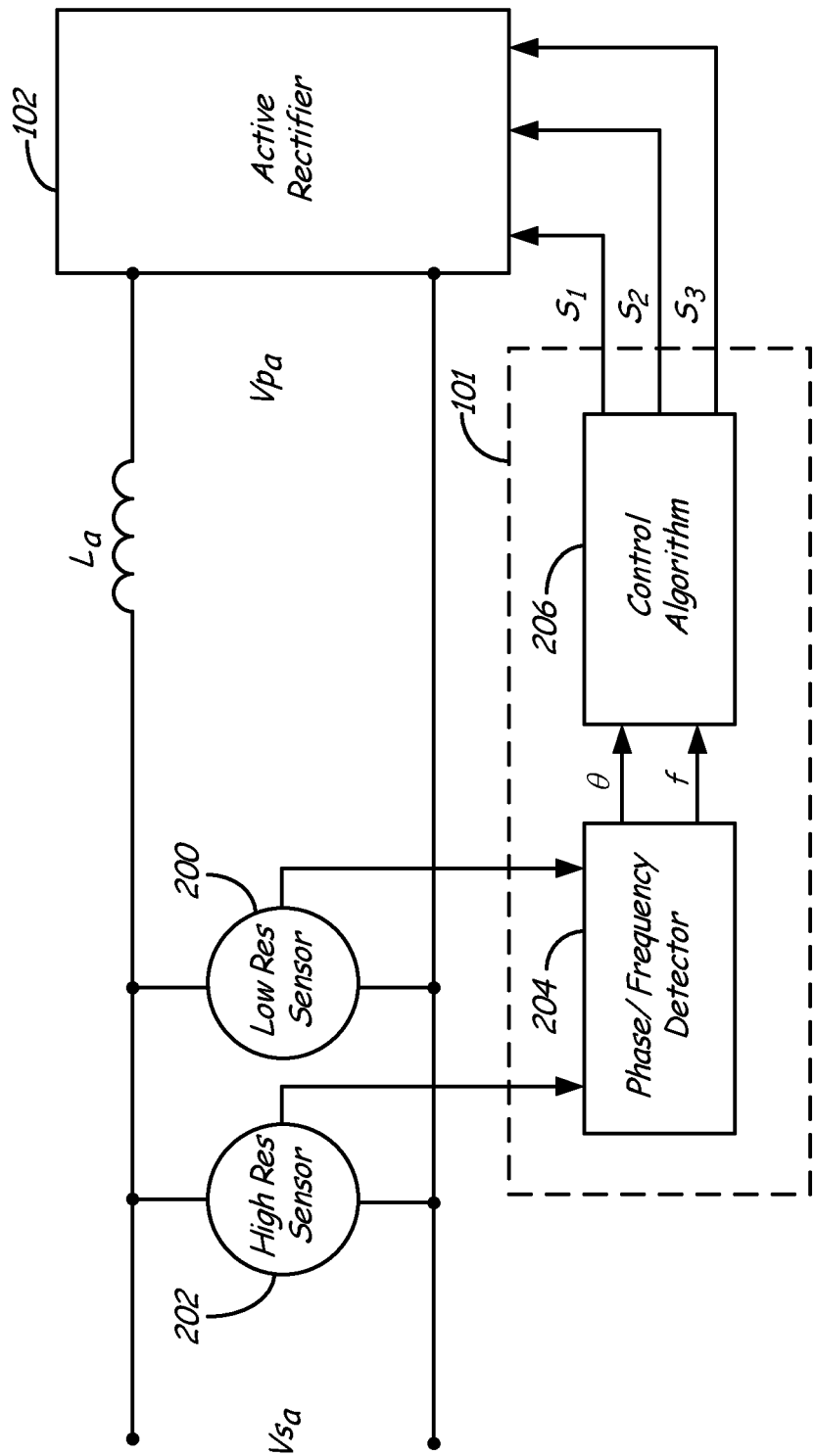
FIG. 2 is a circuit diagram of a portion of the active rectification system that employs a low-resolution sensor and a high-resolution sensor according to an embodiment of the present invention.

FIG. 2 is a circuit diagram of a portion of the active rectification system 100 that employs a low-resolution sensor 200 and a high-resolution sensor 202 according to an embodiment of the present invention. In the embodiment shown in FIG. 2, both the low-resolution sensor 200 and the high-resolution sensor 202 are connected to monitor the source input voltage $Vs_a$ and provide the sampled voltages to the controller 101. Both the low-resolution sensor 200 and the high-resolution sensor 202 sample the monitored voltage at the same rate. The low-resolution sensor 200 provides lower resolution than the high-resolution sensor 202, but is capable of operating over a wider range of voltage values (e.g., ±500V). The high-resolution sensor 202, in contrast, provides better resolution than low-resolution sensor 200 but over a smaller range of voltage values (e.g., ±50V). The term 'resolution' refers to the accuracy of the sampled measurements of the monitored voltage signal. For example, both the low-resolution sensor 200 and the high-resolution sensor 202 may be configured to provide a 12-bit digital representation of the monitored voltage. If the low-resolution sensor 200 operates over a full range of ±500 (i.e., 1000 volts peak-to-peak), the resolution of low-resolution sensor 200 is 0.244 V (e.g., $1000/2^n$, wherein n is the number of bits in the digital representation) per count or increment. If the high-resolution sensor 202 operates over a full range of ±50 (i.e., 100 volts peak-to-peak), the resolution of the high-resolution sensor 202 is 0.0244 V per count or increment. In this example, a ten-fold increase in accuracy is achieved with the high-resolution sensor 202.

Low-resolution sensor 200 is used to monitor the source input voltage $Vs_a$ over the entire range of possible voltage values, while high-resolution sensor 202 is used to monitor the source input voltage $Vs_a$ near zero-crossings. In one embodiment, the controller 101 continuously reads samples or counts from the low-resolution sensor 200 and if the measurements from the low-resolution sensor 200 fall within a range of the high-resolution sensor 202, then measurements from the high-resolution sensor 202 are utilized. Typically, both sensors remain ON at all times, with the controller 101 determining which sensor to utilize. In other embodiments, sensors may be turned ON or OFF when not utilized.

In the embodiment shown in FIG. 2, samples supplied by the low-resolution sensor 200 and the high-resolution sensor 202 are supplied to phase/frequency detector 204 for detection of the phase and frequency associated with the source input voltage $Vs_a$. Frequency detection is provided by the phase/frequency detector 204 by counting the number of samples provided by the low-resolution sensor 200 and the high-resolution sensor 202 during one or more cycles of the source input voltage $Vs_a$. Phase detection is provided by monitoring the amplitude of the source input voltage $Vs_a$ on both sides of a zero-cross event, and using the respective positive and negative voltage measurements to calculate the phase of the source input voltage $Vs_a$. Because the phase measurement is dependent on the amplitude of the monitored source input voltage $Vs_a$, the accuracy of the measurements is critical to accurate phase detection calculations.

In one embodiment, negative-to-positive zero-cross events signify the beginning of a cycle, although positive-to-negative zero-cross events could similarly be employed. A negative-to-positive zero-crossing event may be detected if the following conditions are met. The first condition is a condition where the previous phase voltage sample value is negative or equal to zero. The second condition is a condition where the multiplication of the previous phase voltage sample value (prevV) and the current phase voltage sample value (currV) is negative. Finally, the third condition is a condition where the last m previous phase voltage sample values are all negative, and where m in one example can be set to any number between 3 to 6. The last condition is used to add some hysteresis to zero-crossing detection that might otherwise be affected by transient events or voltage measurements.

In one embodiment, the count of samples provided between negative-to-positive zero cross events is stored in a circular buffer (not shown). Upon occurrence of a zero-crossing event, phase/frequency detector 204 stores a count of the number of samples received from the sensors between consecutive zero-cross events (oneCycleSampSum) to a location in the circular buffer. The size of the circular buffer determines the number of cycles used in frequency calculations. Employing a larger buffer (i.e., greater counts) increases the accuracy of the frequency measurement, but also increases the response time of the frequency measurement system (i.e., increases the time required to respond to a change in frequency). In one embodiment, a buffer size of four was employed. Equation 1, below, illustrates updating of the total number of counts stored in the buffer (SSum) by adding the most recent count of voltage samples (oneCycleSampSum) to the total count value and subtracting the oldest count value stored in the buffer (buffer(i)). In Equation 2, the most recent count of voltage samples (one CycleSampleSum) is stored to the buffer at location i, replacing the oldest count value stored in the buffer.

$$SSum = SSum - buffer(i) + oneCycleSampSum \quad \text{Equation 1}$$

$$buffer(i) = oneCycleSampSum \quad \text{Equation 2}$$

The buffer may be reset (i.e., set i=1) if i is above a predetermined or desired size n. Using the sample sum calculated above, the frequency is calculated based on Equation 3 below:

$$f = \frac{n * sampleRate}{SSum} \quad \text{Equation 3}$$

In this equation, sampleRate is the sample rate of the low-resolution voltage sensor 200 and the high-resolution sensor 202.

The phase of the source input voltage $Vs_a$ is based, in part, on knowledge of the phase difference $\Delta\theta$ between each successive voltage sample provided by the low-resolution sensor 200 and the high-resolution sensor 202. The phase difference is calculated as illustrated in Equation 4, below.

$$\Delta\theta = \frac{2n\pi}{SSum} \quad \text{Equation 4}$$

Based on the phase difference between successive voltage samples, the magnitudes of voltages measured on either side of the zero-cross event can be used to calculate the phase of the source input voltage $Vs_a$. In essence, because the voltage measurements are sampled (i.e., not monitored continuously), an estimate must be made of when the monitored voltage actually crossed the zero point, indicating the start of a new cycle. Due to the linear nature of the AC sine wave around the zero-crossing, the phase of the source input voltage $Vs_a$ can be calculated as illustrated in Equation 5.

$$\theta_{init} = \frac{currV}{currV - prevV}\Delta\theta, \text{ wherein } prevV < 0 \quad \text{Equation 5}$$

The initial phase angle is based on the voltages measured on both sides of the zero-cross event, labeled currV and prevV, along with the known phase difference ($\Delta\theta$) between successive voltage samples. In particular, the initiation phase value $\theta_{init}$ represents the phase of the current voltage value currV. In this embodiment, because negative-to-positive zero-cross events are detected, the previous phase voltage sample value prevV is negative, and the current voltage value currV is positive or zero. The resulting initial phase angle $\theta_{init}$ represents the estimated phase of the source input voltage $Vs_a$ at the time of the measurement of the current phase voltage sample currV. Both the current phase voltage sample currV and the previous phase voltage sample value prevV are provided by the high-resolution sensor 202 to improve the accuracy of the initial phase angle calculation.

The measured phase angle θ provided by phase/frequency detector 204 is set equal to $\theta_{init}$, as illustrated in equation 6.

$$\theta = \theta_{init} \quad \text{Equation 6}$$

In this particular embodiment, subsequent values of θ provided by phase/frequency detector 204 throughout the remainder of the cycle of the source input voltage $Vs_a$ are based on the initial phase angle $\theta_{init}$ and the calculated phase difference $\Delta\theta$. To this end, a phase value $\theta_{old}$ is used to store a previous calculation of phase angle, as shown in equation 7.

$$\theta_{old} = \theta \quad \text{Equation 7}$$

For each new voltage sample measured by either the low-resolution sensor 200 or the high-resolution sensor 202, a new phase angle θ is calculated by the phase/frequency detector 204 based on knowledge of the phase difference $\Delta\theta$ between successive voltage samples calculated with respect to Equation 4. In this way, after the initial phase angle detection associated with the zero-cross event, phase angle calculation does not depend on an input source voltage between two zero-crossing events, but is calculated as an accumulation of $\Delta\theta$ to the initial detected phase until a new zero cross event is detected as illustrated in Equation 8, below.

$$\theta = \theta_{old} + \Delta\theta \quad \text{Equation 8}$$

It should be noted that false detections of zero-crossing events may become an issue if an input voltage is relatively noisy. However, a threshold may be used to limit this error. For example, a detected zero-crossing event may be neglected if the accumulated sum of samples is less than this threshold.

The phase θ and the frequency f calculated by phase/frequency detector 204 is provided to control algorithm 206, which may also receive information regarding the monitored output voltage Vdc and the monitored input currents ia, ib, ic. Based on these inputs, control algorithm 206 calculates switching signals for provision to the active switching elements S1, S2, S3 within the active rectifier 102.

In this way, the present invention provides improved phase detection. In particular, the present invention provides improved phase detection in systems in which the magnitude of the voltage measured near zero-cross events (i.e., zero-cross based phase detection) is employed to detect phase of an AC input. With respect to phase detection for use in controlling an active rectifier, tests of the system employing the high-resolution sensor showed an improvement in the even harmonics associated with the three-phase input current, which improves the power quality of the system. While marked improvement has been demonstrated with respect to the operation of active rectifiers, the present invention may be applicable to other applications making use of zero-cross based phase detection.

While the invention has been described with reference to an exemplary embodiment(s), it will be understood by those skilled in the art that various changes may be made and equivalents may be substituted for elements thereof without departing from the scope of the invention. For example, the functionality of the controller 101 described with respect to FIGS. 1 and 2 was divided into control/detection functions. In other embodiments, these functions may be performed by a single device, or further bifurcated into additional separate devices. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A phase detection system comprising:
 a low-resolution sensor for monitoring an alternating current (AC) voltage;
 a high-resolution sensor for monitoring the AC voltage; and
 a phase detector that receives voltage samples from the low-resolution sensor and the high-resolution sensor, wherein the phase detector employs high-resolution voltage samples when the low-resolution voltage samples indicate an approaching zero-cross event, wherein the phase detector employs magnitude of the high-resolution voltage samples received on either side of a zero-cross event to determine a phase associated with the monitored AC voltage.

2. The phase detection system of claim 1, wherein the phase detector calculates an initial phase of the AC voltage based on the following equation:

$$\theta_{init} = \frac{currV}{currV - prevV} * \Delta\theta,$$

wherein currV represents the current voltage phase sample, prevV represents a previous phase voltage value, and $\Delta\theta$ represents a calculated phase difference between successive voltage sample values.

3. The phase detection system of claim 2, wherein the calculated phase difference $\Delta\theta$ is calculated based on a count of voltage samples measured during one or more cycles of the monitored AC voltage.

4. The phase detection system of claim 2, wherein successive estimates of the phase associated with the monitored AC voltage are based on the initial phase angle $\theta_{init}$ and the calculated phase difference $\Delta\theta$.

5. The phase detection system of claim 1, wherein the low-resolution sensor has a resolution based on an entire range of voltage values associated with the monitored input voltage, and wherein the high-resolution sensor has a resolution based on a range of voltage values smaller than that of the low-resolution sensor.

6. A zero-cross based method of phase detection, the method comprising:
 monitoring an alternating current (AC) voltage with a low-resolution sensor;
 monitoring the AC voltage with a high-resolution sensor when the low-resolution sensor indicates the AC voltage is nearing a zero-cross event;
 storing a previous voltage value and a current voltage value provided by the high-resolution sensor;
 detecting a zero-cross event between the previous voltage value and the current voltage value;
 estimating an initial phase of the AC voltage based on the current voltage value, the previous voltage value, and an estimated phase difference between successive voltage values provided by the high-resolution sensor; and
 estimating subsequent phase values associated with the AC voltage based on the initial phase estimate.

7. The method of claim 6, wherein detecting the zero-cross event includes multiplying the previous voltage value and the current voltage value, wherein a negative result indicates a zero-cross event.

8. The method of claim 6, wherein estimating the initial phase of the AC voltage is based on the following equation:

$$\theta_{init} = \frac{currV}{currV - prevV} * \Delta\theta,$$

wherein currV represents the current voltage phase sample, prevV represents a previous phase voltage value, and $\Delta\theta$ represents a calculated phase difference between successive voltage sample values.

9. The method of claim 8, wherein the calculated phase difference $\Delta\theta$ is calculated based on a count of voltage samples measured during one or more cycles of the monitored AC voltage.

10. The method of claim 8, wherein estimating subsequent phase values associated with the AC voltage are further based on the calculated phase difference $\Delta\theta$.

11. An active rectification system comprising:
 an active rectifier having a plurality of switching elements selectively controlled to convert an alternating current (AC) input voltage to a direct current (DC) output voltage;
 a high-resolution sensor connected to monitor the AC input voltage provided to the active rectifier;
 a low-resolution sensor connected to monitor the AC input voltage provided to the active rectifier;
 a controller connected to receive high-resolution voltage samples measured by the high-resolution sensor and low-resolution voltage samples measured by the low-resolution sensor, the controller including:

a phase/frequency detector that detects phase and frequency information associated with the AC input voltage, wherein the phase/frequency detector employs the high-resolution voltage samples when the low-resolution voltage samples indicate an approaching zero-cross event, wherein the phase/frequency detector employs a magnitude of the high-resolution voltage samples received on either side of a zero-cross event to determine a phase associated with the AC input voltage; and a controller that receives phase and frequency information provided by the phase/frequency detector, and in response generates signals to selectively control the active switching elements within the active rectifier.

12. The active rectification system of claim 11, wherein the phase/frequency detector calculates an initial phase of the AC voltage based on the following equation:

$$\theta_{init} = \frac{currV}{currV - prevV} * \Delta\theta,$$

wherein currV represents the current voltage phase sample, prevV represents a previous phase voltage value, and ?è represents a calculated phase difference between successive voltage sample values.

13. The active rectification system of claim 12, wherein the calculated phase difference ?è is calculated based on a count of voltage samples measured during one or more cycles of the monitored AC voltage.

14. The active rectification system of claim 12, wherein successive estimates of the phase associated with the monitored AC voltage are based on the initial phase angle $è_{init}$ and the calculated phase difference ?è.

15. The active rectification system of claim 11, wherein the low-resolution sensor has a resolution based on an entire range of voltage values associated with the monitored input voltage, and wherein the high-resolution sensor has a resolution based on a range of voltage values smaller than that of the low-resolution sensor.

16. The active rectification system of claim 11, wherein the phase/frequency detector calculates frequency of the AC input based on a count of samples received between one or more zero-cross events.

* * * * *